(12) United States Patent
Nightingale

(10) Patent No.: US 7,740,497 B2
(45) Date of Patent: Jun. 22, 2010

(54) ELECTRICAL CONNECTION SYSTEM

(75) Inventor: Christopher George Edward Nightingale, Singapore (SG)

(73) Assignee: Dragon Energy Pte. Ltd., Singapore (SG)

( * ) Notice: Subject to any disclaimer, the term of this patent is extended or adjusted under 35 U.S.C. 154(b) by 0 days.

(21) Appl. No.: 12/248,028

(22) Filed: Oct. 8, 2008

(65) Prior Publication Data

US 2009/0098775 A1  Apr. 16, 2009

(30) Foreign Application Priority Data

Oct. 9, 2007 (SG) .............................. 200716872-7

(51) Int. Cl.
*H01R 4/60* (2006.01)
(52) U.S. Cl. ..................................... 439/215
(58) Field of Classification Search ................. 439/191, 439/192, 193, 194, 195, 207–216
See application file for complete search history.

(56) References Cited

U.S. PATENT DOCUMENTS 5,183,406 A * 2/1993 Glen .......................... 439/120
5,759,051 A * 6/1998 Cancellieri et al. .......... 439/118
2003/0194895 A1* 10/2003 Stockel et al. ............... 439/215

* cited by examiner

*Primary Examiner*—Ross N Gushi
(74) *Attorney, Agent, or Firm*—Intellectual Property Law Group LLP; Juneko Jackson; Otto O. Lee

(57) ABSTRACT

An electrical connection system for providing electrical connection between first and second devices comprises one or more electrical connection posts and one or more electrical connection tubes. Each post has a first end and an opposite second end, where the first end is configured to electrically connect with a first device such as a photovoltaic cell. Each tube has an opening to receive and provide electrical connection with the second end of a respective post. First and second end connectors are provided at respective opposite axial ends of a connection tube to enable end to end electrical connection between adjacent tubes. The opening comprises a longitudinal slot together with a plurality of secondary slots. Each secondary slot comprises a first length that extends in a circumferential direction, and a second length that extends in the axial direction, with a circular portion that acts as an electrical contact. In order to connect the posts to a tube the tube is orientated so that the ends of the posts are in alignment with the slot. The tube is then slid axially so that the ends of the post are located within the slot and inside the tube adjacent respective first lengths of a slot. The tube is then rotated about its longitudinal axis and then slid axially so as to finally locate the ends within the circular portions.

18 Claims, 5 Drawing Sheets

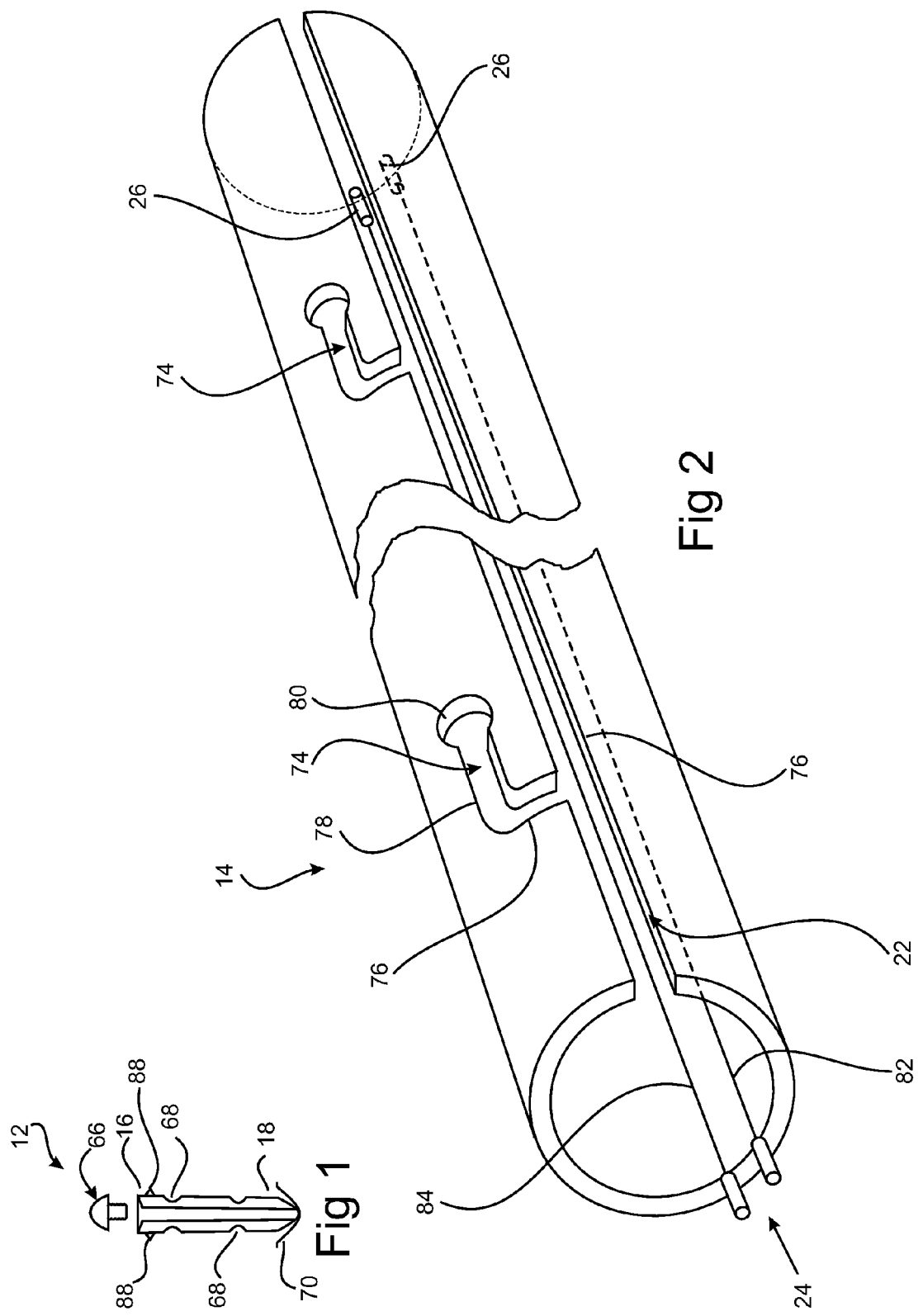

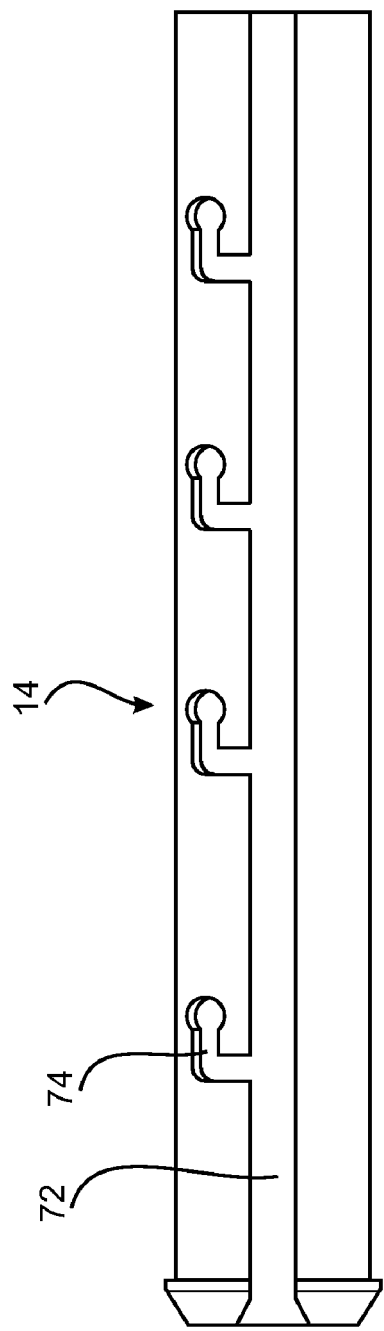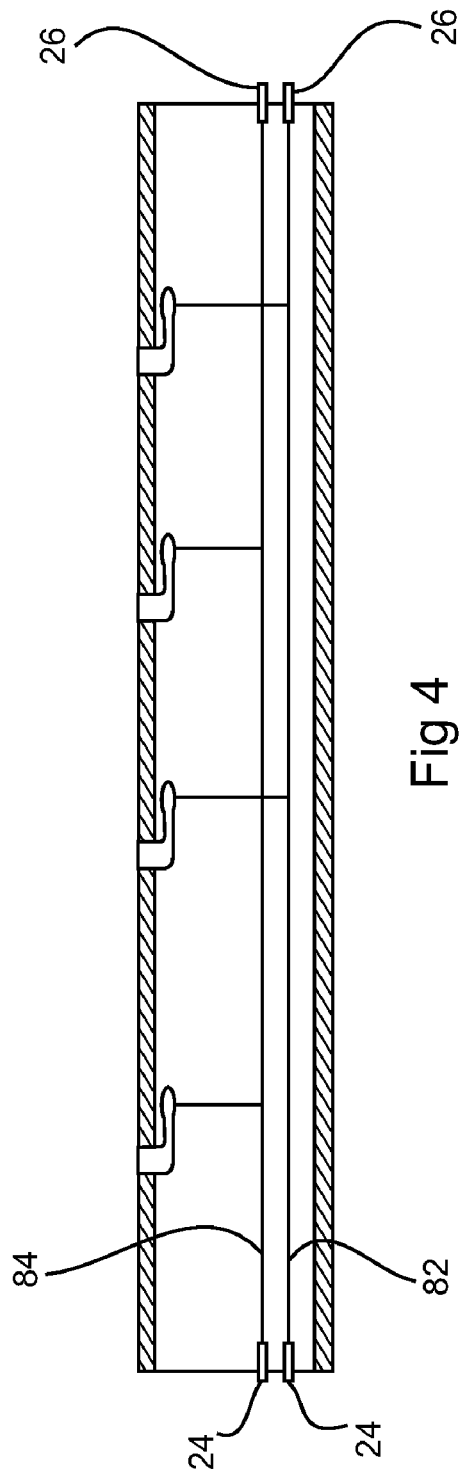

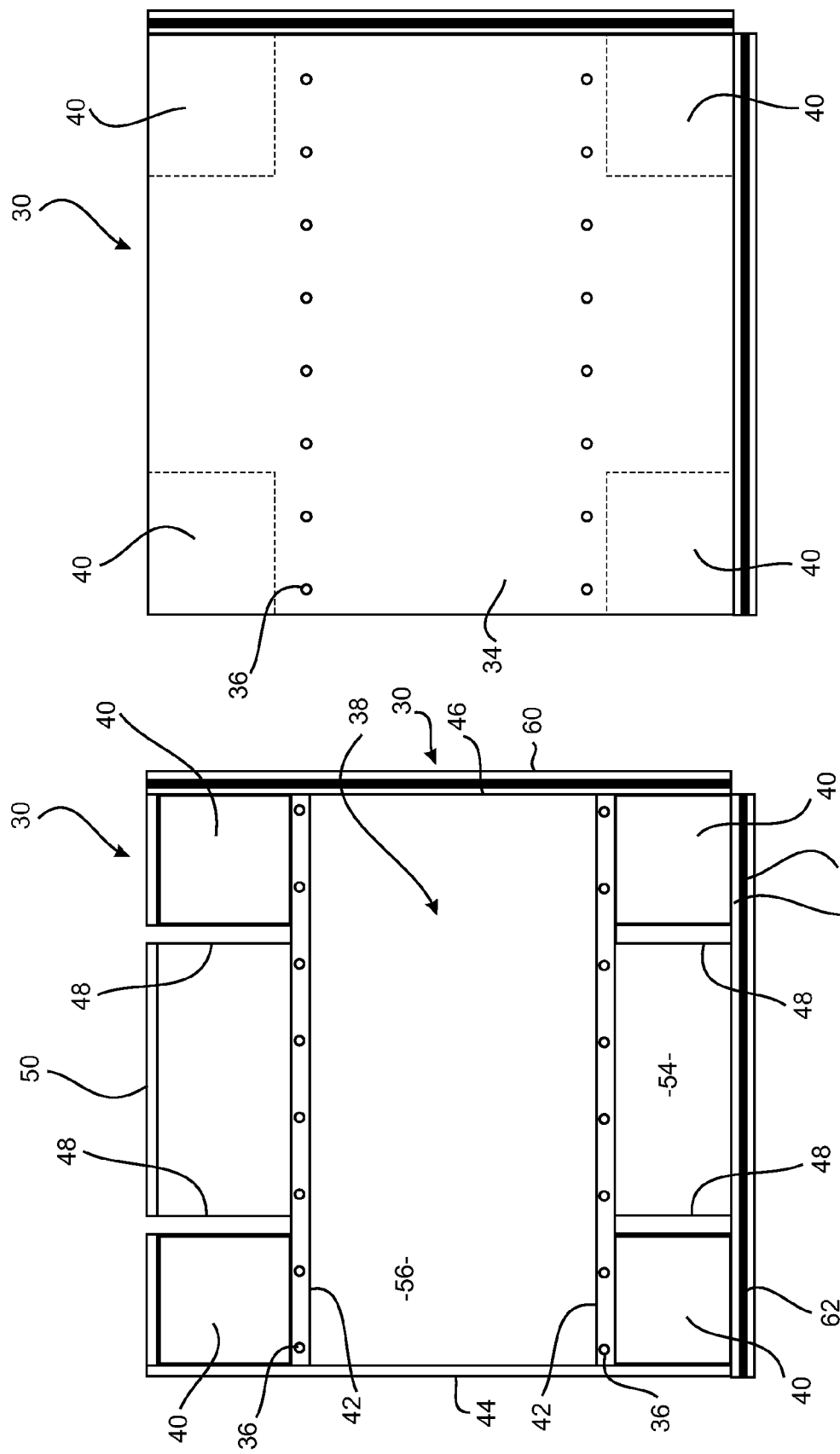

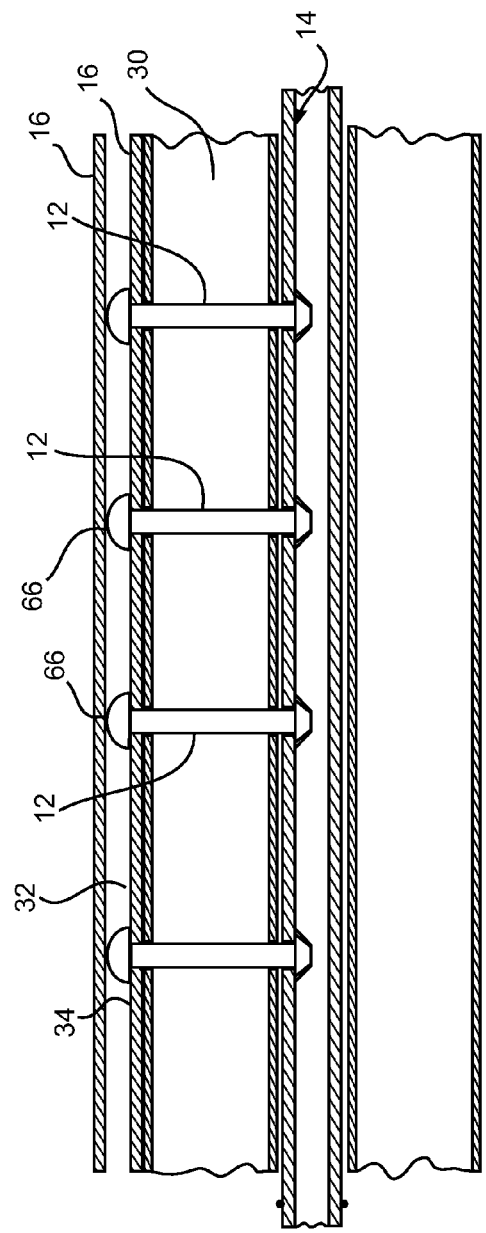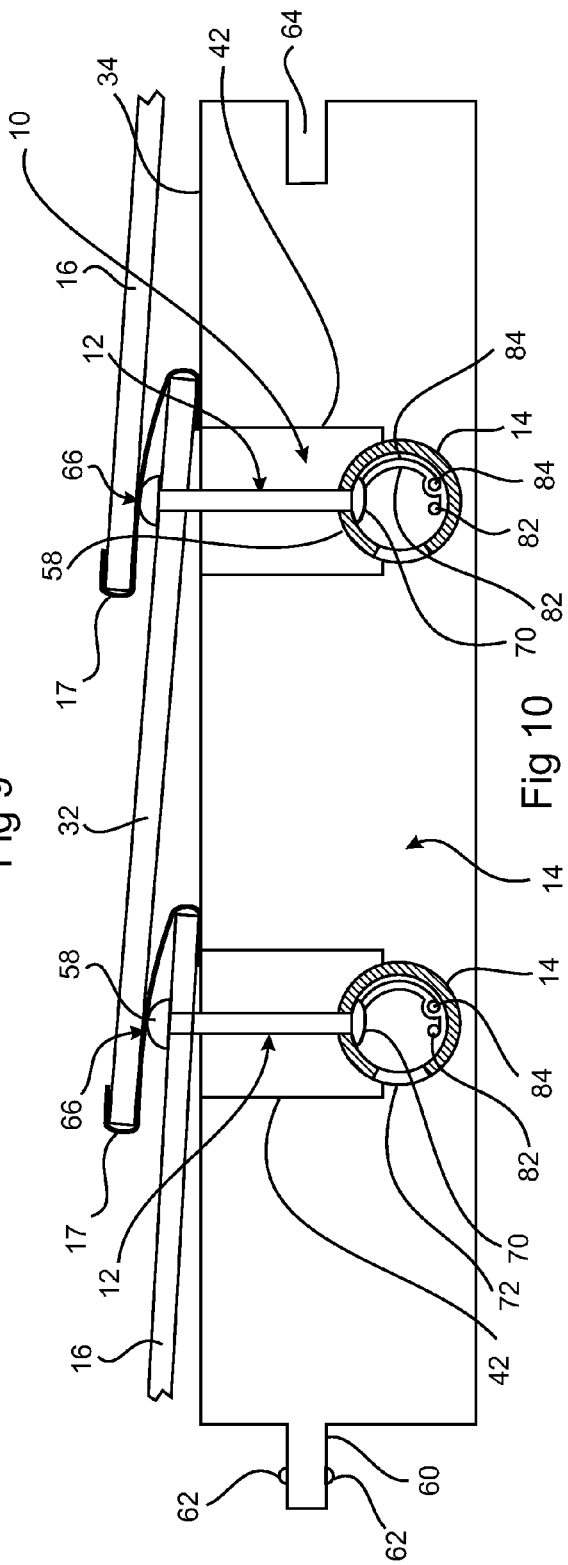

ELECTRICAL CONNECTION SYSTEM

CROSS-REFERENCE TO RELATED PATENT APPLICATION

This application claims the benefit of Singapore Patent Application No. 200716872-7, filed on Oct. 9, 2007, the disclosure of which is incorporated herein in its entirety by reference.

BACKGROUND OF THE INVENTION

1. Field of the Invention

The present invention relates to an electrical connection system for providing electrical connection between first and second devices or components.

2. Background

The present invention was developed by considering the requirement of providing electrical connection between adjacent separate photovoltaic cells or tiles as may, for example, be provided in solar electric panels or on a roof provided with or solar electric roof tiles.

Electrical connection between such separate cells or tiles may be made using traditional methods such as:
   soldering of wires;
   use of connection blocks that usually comprise an insulating block of material housing a conducting tube that receives a plurality of wires and a screw that can be screwed into the tube to mechanically and electrically engage the wires; and,
   use of mating plugs.

However such methods of connection may be problematic when used for photovoltaic cells of tiles due to the need for the connections to be made on the side of the cell or tile that is attached to a supporting structure such as roof beams.

While the invention was initially developed with application in relation to photovoltaic cells and solar tiles, embodiments of the present invention may be applied to any application where it is required to electrically couple two or more devices or components. For example embodiments of the invention may be used to electrically couple for example one or more sensors in an array to a processor.

It is to be understood that, if any prior art publication is referred to herein, such reference does not constitute an admission that the publication forms a part of the common general knowledge in the art, in Australia or any other country.

SUMMARY OF THE INVENTION

An electrical connection system for providing electrical connection between first and second devices, the electrical connection system comprising:
   at least one electrical connection post, the or each post having first and second ends, the first end configured to electrically connect with a first device; and,
   at least one electrical connection tube, the or each tube having an opening to receive and provide electrical connection with a second end of respective posts, and end connectors at each axial end of the tube, the end connectors configured to electrically connect with end connectors of an adjacent tube wherein a second device can be electrically connected with the end connector of a tube and thereby electrically connected with the first device.

The opening in each tube may comprise a longitudinal slot for receiving the second end of a post, the longitudinal slot being open at least one end of the tube.

In one embodiment the longitudinal slot opens onto both ends of the tube.

The system may further comprise at least one secondary slot extending from the longitudinal slot, the or each secondary slot configured to receive and provide electrical connection with the second end of a respective post.

Each tube may further comprise a first conductor extending between respective end connectors and electrically coupled with a first group of secondary slots, and a second conductor extending between respective end connectors and electrically coupled with a second group of second slots, wherein the first and second conductors are electrically isolated from each other.

In one embodiment of the system each tube is further provided with complementary couplings at each end to enable mechanical coupling between adjacent tubes.

These and other embodiments of the present invention are further made apparent, in the remainder of the present document, to those of ordinary skill in the art.

BRIEF DESCRIPTION OF THE DRAWINGS

An embodiment of the present invention will now be described by way of example only with reference to the accompanying drawings in which:

FIG. 1 is a schematic representation of an electrical connection post incorporated in the electrical connection system;

FIG. 2 is a perspective view of an electrical connection tube incorporated in the electrical connection system;

FIG. 3 is a plan view of the tube shown in FIG. 2; and,

FIG. 4 is a section view of a tube shown in FIGS. 2 and 3;

FIG. 5 is a section elevation view of a base tile incorporated in an embodiment of a the electrical connection system in accordance with the present invention;

FIG. 6 is a top elevation view of the base tile shown in FIG. 5;

FIG. 9 is a lateral section view of a photovoltaic tile assembly incorporating the electrical connection system, base tile and cover tile; and, FIG. 10 is a transverse section view of the photovoltaic tile assembly shown in FIG. 9.

DETAILED DESCRIPTION OF SPECIFIC EMBODIMENTS

Figure 7:
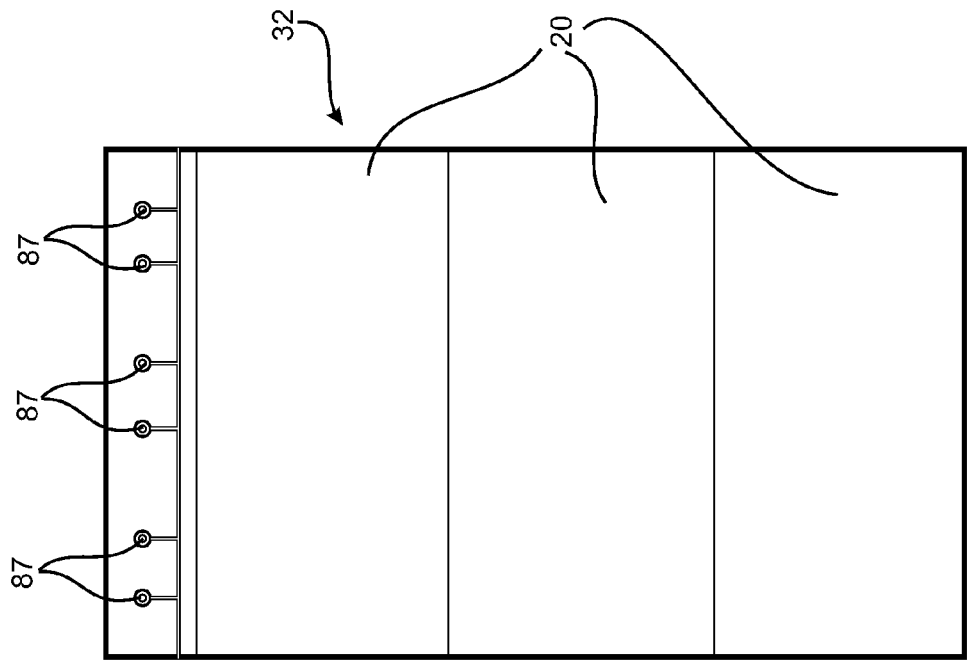
FIG. 7 is a bottom elevation view of a cover tile incorporated in the photovoltaic tile assembly.

Referring to the accompanying drawings, and in particular FIGS. 1 and 2, an embodiment of the electrical connection system 10 for providing electrical connection between first and second devices comprises one or more electrical connection posts 12 (shown in FIG. 1) and one or more electrical connection tubes 14 (shown in FIG. 2). Each post 12 has a first end 16 and a second opposite end 18, where the first end 16 is configured to electrically connect with a first device such as a photovoltaic cell 20. As seen most clearly in FIG. 2, each tube 14 has an opening 22 to receive and provide electrical connection with the second end 18 of a respective post 12. First and second end connectors 24 and 26 are provided at respective opposite axial ends of a connection tube 14 to enable end to end electrical connection between adjacent tubes 14. The end connectors 24 and 26 facilitate electrical connection with a second device.

In the embodiment described in greater detail below where the electrical connection system 10 is incorporated in a photovoltaic tile assembly, the photovoltaic cells 20 may be considered as a first device and an electrical power management system and/or an electrical storage device such as a battery may be considered as the second device. Thus the connection system 10 enables electrical connection between the photovoltaic cells 20 and a management unit or storage device.

Figure 8:
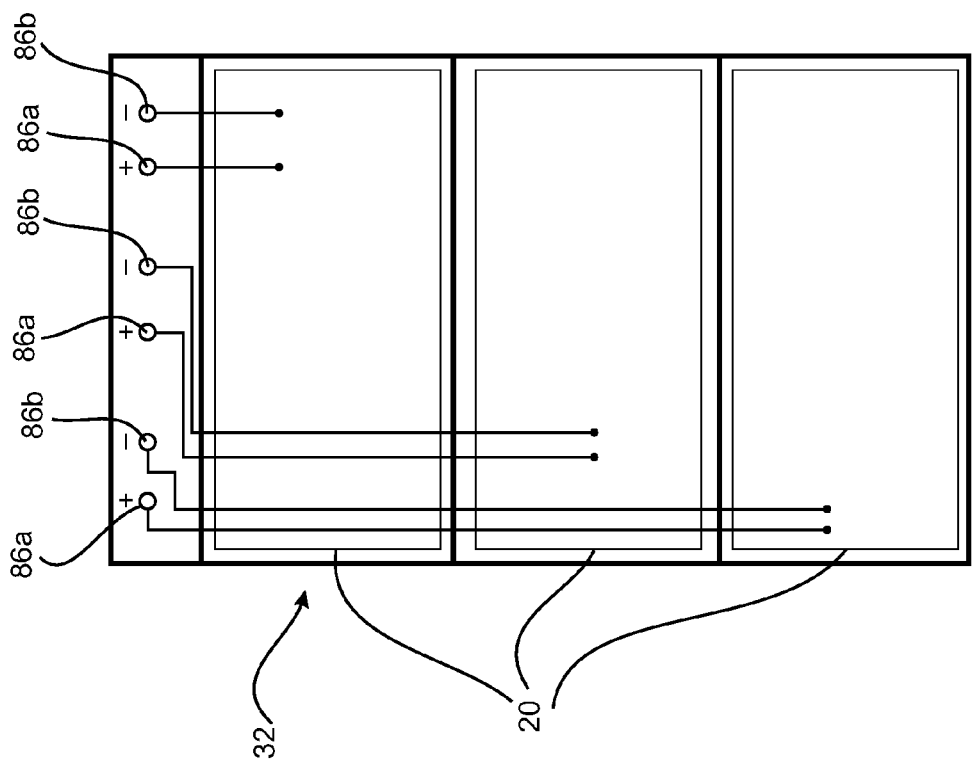
FIG. 8 is a top elevation view of the cover tile shown in FIG. 7.

FIGS. 5-10 depict photovoltaic tile assembly 28 incorporating the electrical connection system 10. The tile assembly 28 comprises a base tile 30 and one or more cover tiles 32 each having one or more PV cells 20.

While the specific construction of the tile assembly 28 is immaterial to the broad form of the connection system 10 the tile assembly 28 will be described to provide context to one particular application of the connection system 10. The base tile 30 is in the shape and form of a square plate having a planar and substantially continuous upper surface 34, the continuity of which is interrupted only by a series of transversely extending holes 36 through which the posts 12 are inserted. An underside 38 of the base tile 30 is formed with a plurality of walls or ribs which divide the underside 38 into a number of different sections. In this particular embodiment, each of the four corners 40 of the base tile 30 is formed of solid material which may be used to receive a mechanical fastener such as a nail or a screw.

A pair of parallel walls 42 extend between opposite sides 44 and 46 of the base tile 30 and in part form a boundary of the solid portions 40. The base tile 30 further comprises walls 48 extending perpendicular to the walls 42 which also bound respective sides of the solid portions 40. The walls 48 extend between respective adjacent sides 50 and 52 of the base tile 30 and the nearest wall 42. By this configuration, the underside 38 of the base tile 30 is formed with compartments 54 adjacent the sides 50 and 52, and a larger central compartment 56 between the walls 42. As shown most clearly in FIG. 10, the walls 42 are provided with recesses 58 for receiving the tubes 14.

To assist in providing waterproof coupling between adjacent tile assemblies 28, each of the base tiles 30 is provided along two longitudinal edges with laterally extending tongues 60 each of which is provided with longitudinally extending rubber seals 62 on their upper and lower surfaces. Two complementary grooves 64 are formed along the remaining two sides of the base tile 30 for receiving the tongues 60 of adjacent base tiles 30.

Referring in particular to FIGS. 1, 2, 9 and 10, it can be seen that each post 12 is in the form of a tube having an opening at its first end 16 for receiving an end cap in the form of a rubber grommet 66. The end cap or grommet 66 may be formed of a resilient material such as rubber and is retained in the end 16 by one or both of an interference fit and the use of adhesives. For example, the grommet 66 may be provided with a plurality of circumferential ribs that are compressed by insertion of the grommet 66 into the end 16 to thereby provide an interference fit. Additionally, adhesive may be applied to the ribs or on the inside of the post 12 at end 16. In a further variation however if desired the caps may be formed from a combination of a threaded fastener and a rubber seal and/or washer retained on a shank of the fastener by a head of the fastener, with a complementary thread for engaging the fastener formed inside the post near end 16.

The post 12 is itself made of an electrically conducting material such as steel or stainless steel so that electricity can flow between the ends 16 and 18 of the post 12.

In the illustrated embodiment, the post 12 is formed with a pair of circumferential and axially spaced apart grooves or recesses 68. The recesses 68 receive corresponding protrusions formed in the holes 36 in the base tile 30 into which the posts 12 are inserted. Protrusions mate with the grooves or recesses 68 to form a waterproof seal between each post 12 and the base tile 30.

A conductive spring 70 is electrically connected with and mechanically coupled to the end 18 of each post 12. This may be achieved for example by soldering or spot welding the spring 70 onto the end 18. However in a further variation, the springs 70 may be formed separately from the post 12 and attached to the post 12 after its installation. For example this may be achieved by use of a screw and a separate spring retained on the head of the screw where the screw can be threadingly engaged with a mating thread formed on the inside of the post 12 at end 18. In this variation the post 12 could be provided with an external screw thread to enable the post to be screwed into a substrate or article rather than being pushed through a hole. In yet a further possible variation the first end 16 may be formed with an integral cap or head.

As previously mentioned, each tube 14 comprises an opening 22 to receive and provide electrical connection with the second end 18 of a post 12. Each opening 22 comprises a longitudinal slot 72 which, in this embodiment, extends for the entire length of the tube 14, together with a plurality of secondary slots 74 that extend from the longitudinal slot 72. The secondary slots 74 comprise a first length 76 that extends in a circumferential direction, a second length 78 that extends in the axial direction and a circular portion 80 which is configured to act as an electrical contact.

The first end connectors 24 may be in the form of a spring loaded or biased pins or plugs while the second end connectors 26 may be in the form of sockets. The pins or plugs 24 can be retracted to lie substantially flush with the adjacent end of the tube 14 during coupling of the tubes 14. In a further variation, the sockets 26 may also be formed so as to be linearly retractable under the influence of a bias mechanism such as a spring so that they can extend in the axial direction from an adjacent end of the tube 14. In yet a further variation, the first connectors 24 may be in the form of spring biased electrically conducting balls that are retained in the adjacent end of the tube 14 and are biased so that a portion of each ball can extend from the axial end of the tube 14 while being retained in the tube 14. In this variation, the second end connectors 26 may be in the form of cups or depressions formed in the opposite end of the tube 14 for receiving portions of the balls extending from an adjacent tube 14.

As is evident from the Figures, in this particular embodiment, there are two first end connectors 24 at one end of the tube 14 and two second end connectors 26 at an opposite end of the tube 14. A first conductor 82 connects one of the first end connectors 24 to one of the second end connectors 26 and also provides electrical coupling with a group of the secondary slots 74 and in particular the circular portion 80 at an end of each secondary slot 74. Similarly, a second conductor 84 provides electrical connection between the other first and second end connectors 24 and 26 and a second group of the secondary slots 74 and corresponding circular portions 80. More particularly, the conductors 82 and 84 provide electrical connection to alternate circular portions 80 which are electrically connected with positive and negative terminals 86a and 86b of the PV cells 20. Thus in effect, the positive terminals 86a of each PV cell 20 is electrically coupled with the conductor 82 while the negative terminals 86b of each PV cell 20 is electrically connected with the conductor 84.

The terminals 86a and 86b (hereinafter referred to in general as "terminals 86") are in the form of through holes 87 formed in each cover tile 32 and provided with electrically conductive surfaces. Contact between the posts 12 and the surfaces of the holes 87 formed in the cover tiles 32 and the exterior surface for the posts 12 provide electrical coupling. To enhance the electrical coupling, the post 12 may be further provided with one or more biased contact surfaces such as springs or resilient members 88 near the first end 16. The springs 88 may be in the form for example of those commonly found on "banana plugs".

Each axial end of a tube 14 may be provided with some form of mechanical coupling to enable coupling of the ends of adjacent tubes 14. This may be achieved for example by some form of interference fit, or by the use of "click connectors" between adjacent tubes 14. The specific form of the mechanical couplings at each end of the tube are not critical to the function or operation of embodiments of the connection system 10.

The manner of operation of the electrical connection system 10 will now be described with reference to the process of construction and installation the tile assemblies 28 on a structure such as a timber roof frame. Initially, posts 12 without their corresponding cap or grommet 66 are pushed into the holes 36 formed in the base tiles 30 with the second end 18 being pushed through the hole from the surface 34. The posts 12 are pushed to the extent that the end 18 and in particular the spring 70 extends into the recess 58. The post 12 is dimensioned so that the first end 16 extends above the surface 34 when the spring 70 is located within the recess 58. Once all the posts 12 are inserted into the holes 36 in the base tile 30, respective tubes 14 can be placed in corresponding recesses 58 with the ends 18 and springs 70 located in the longitudinal slot 22. This may be typically achieved by sliding a tube 14 into its respective recess 58 so that the spring 70 is located inside of the tube 14. The tube 14 is slid to a position where the ends 18 and springs 70 of each post 12 are adjacent a corresponding secondary slot 74. The tubes may then be rotated by a distance equal to the length of the first length 76 of a slot 74 so as to place the ends 18 adjacent the second length 78 of the secondary slot 74. The tube may then be again slid in the axial direction so as to finally locate the ends 18 within the circular portion 80 with the spring 70 bearing against an inside surface of the tube 14 about the circular portion 80. Thus electrical connection is now provided from the terminals 86 via the posts 12 to the conductors 82 and 84 and thus to respective first and second end connectors 24 and 26. The base tile 30 can now be fixed into place on the supporting structure for example by driving nails or screws through the solid portions 40 onto underlying elements of the frame.

A second tile which has been assembled in the same manner as described above can then be laid adjacent the tile previously laid with the respective tongue and groove portions mutually engaging each other. Electrical connection between adjacent tubes 14 is achieved by the mutual engagement and electrical coupling between the first or second end connectors 24, 26 of one tube 14 and the second and first connectors 24, 26 of an adjacent tube 14. Thus an electrical connection path is formed along the adjacent tubes 14 to a second device such as an electrical energy management unit, or a storage device such as a battery.

Modifications and variations in the electrical connection system 10 that would be obvious to a person of ordinary skill in the art are deemed to be within the scope of the present invention, the nature of which is to be determined from the above description and the appended claims.

Such modifications and variations may include for example forming the tubes 14 to have a square cross-section shape rather than a circular cross-section. In such an embodiment the slot 72 and secondary slots 74 would be formed on the same face of the tube. Also the posts 12 may be formed primarily from an insulating material such as plastics or rubber and have embedded electrical conductors to allow conduction of electricity. Further embodiments of the electrical connection system 10 may be used in any application where it is desired to electrically connect two or more devices or components, not only for photovoltaic tiles.

In the claims of this application and in the description of the invention, except where the context requires otherwise due to express language or necessary implication, the words "comprise" or variations such as "comprises" or "comprising" are used in an inclusive sense, i.e. to specify the presence of the stated features but not to preclude the presence or addition of further features in various embodiments of the invention.

It is to be understood that, if any prior art publication is referred to herein, such reference does not constitute an admission that the publication forms a part of the common general knowledge in the art, in Australia or any other country.

Throughout the description and drawings, example embodiments are given with reference to specific configurations. It will be appreciated by those of ordinary skill in the art that the present invention can be embodied in other specific forms. Those of ordinary skill in the art would be able to practice such other embodiments without undue experimentation. The scope of the present invention, for the purpose of the present patent document, is not limited merely to the specific example embodiments or alternatives of the foregoing description.

I claim:

1. An electrical connection system for providing electrical connection between first and second devices, the electrical connection system comprising:
    at least one electrical connection post, each post having first and second ends, the first end configured to electrically connect with a first device;
    at least one electrical connection tube, each tube having an opening to receive and provide electrical connection with a second end of a respective post, and a plurality of end connectors at each of an axial end of the tube, the end connectors configured to electrically connect with end connectors of an adjacent tube wherein a second device can be electrically connected with the end connector of a tube and thereby electrically connect with the first device; and
    wherein each end connector at one end of the tube comprises a first connector that is adjustable between an extended and a retracted position, and biased toward the extended position.

2. The system according to claim 1, wherein the opening in each tube comprises a longitudinal slot for receiving the second end of a post, the longitudinal slot being open at least one end of the tube.

3. The system according to claim 2, wherein the longitudinal slot opens onto both ends of the tube.

4. The system according to claims 2 or 3, further comprising at least one
    secondary slot extending from the longitudinal slot, each secondary slot configured to receive and provide electrical connection with the second end of a respective post.

5. The system according to claim 4, wherein each tube further comprises a first conductor extending between respective end connectors and electrically coupled with a first group of secondary slots, and a second conductor extending between respective end connectors and electrically coupled with a second group of second slots, wherein the first and second conductors are electrically isolated from each other.

6. The system according to any one of claims 1-3, wherein each end connector at an opposite end of the tube comprises a second connector for receiving a corresponding first connector.

7. The system according to any one of claims 1-3, wherein each tube is further provided with complementary couplings at each end to enable mechanical coupling between adjacent tubes.

8. The system according to any one of claims 1-3, wherein the posts are formed with at least one recess with at least one circumferential groove.

9. The system according to any one of claims 1-3, wherein at least one post is provided with a first resilient electrical connection device at the first end of the post.

10. The system according to any one of claims 1-3, wherein at least one post is provided with a second resilient electrical connection device at the second end of the post.

11. An electrical connection system for providing electrical connection between first and second devices, the electrical connection system comprising:
- at least one electrical connection post, each post having first and second ends, the first end configured to electrically connect with a first device;
- at least one electrical connection tube, each tube having an opening to receive and provide electrical connection with a second end of a respective post, and a plurality of end connectors at each of an axial end of the tube, the end connectors configured to electrically connect with end connectors of an adjacent tube wherein a second device can be electrically connected with the end connector of a tube and thereby electrically connect with the first device;
- wherein each end connector at one end of the tube comprises a first connector that is adjustable between an extended and a retracted position, and each end connector at an opposite end of the tube comprises a second connector for receiving a corresponding first connector; and
- wherein the first connector is one of a plug pin and a ball; and the second connector is a socket.

12. The system according to claim 11, wherein the opening in each tube comprises a longitudinal slot for receiving the second end of a post, the longitudinal slot being open at least one end of the tube.

13. The system according to claim 12, wherein the longitudinal slot opens onto both ends of the tube.

14. The system according to claims 12 or 13, further comprising at least one secondary slot extending from the longitudinal slot, each secondary slot configured to receive and provide electrical connection with the second end of a respective post.

15. An electrical connection system for providing electrical connection between first and second devices, the electrical connection system comprising:
- at least one electrical connection post, each post having first and second ends, the first end configured to electrically connect with a first device;
- a cap for each post, the cap and the first end of the post configured to engage each other, the cap having a head that extends laterally of the first end of the post; and
- at least one electrical connection tube, each tube having an opening to receive and provide electrical connection with a second end of a respective post, and a plurality of end connectors at each of an axial end of the tube, the end connectors configured to electrically connect with end connectors of an adjacent tube wherein a second device can be electrically connected with the end connector of a tube and thereby electrically connect with the first device.

16. The system according to claim 15, wherein the opening in each tube comprises a longitudinal slot for receiving the second end of a post, the longitudinal slot being open at least one end of the tube.

17. The system according to claim 16, wherein the longitudinal slot opens onto both ends of the tube.

18. The system according to claims 16 or 17, further comprising at least one secondary slot extending from the longitudinal slot, each secondary slot configured to receive and provide electrical connection with the second end of a respective post.

* * * * *